(12) United States Patent
Heo et al.

(10) Patent No.: US 10,211,339 B2
(45) Date of Patent: Feb. 19, 2019

(54) VERTICAL TRANSISTOR HAVING A SEMICONDUCTOR PILLAR PENETRATING A SILICIDE FORMED ON THE SUBSTRATE SURFACE

(71) Applicant: Samsung Electronics Co., Ltd., Suwon-si (KR)

(72) Inventors: YeonCheol Heo, Suwon-si (KR); Mirco Cantoro, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/397,011

(22) Filed: Jan. 3, 2017

(65) Prior Publication Data

US 2017/0271508 A1  Sep. 21, 2017

(30) Foreign Application Priority Data

Mar. 21, 2016  (KR) ........................ 10-2016-0033520

(51) Int. Cl.
| | |
|---|---|
| H01L 29/06 | (2006.01) |
| H01L 29/08 | (2006.01) |
| H01L 29/10 | (2006.01) |
| H01L 29/45 | (2006.01) |
| H01L 29/66 | (2006.01) |

(Continued)

(52) U.S. Cl.
CPC ...... *H01L 29/7827* (2013.01); *H01L 29/0649* (2013.01); *H01L 29/0847* (2013.01); *H01L 29/1037* (2013.01); *H01L 29/41741* (2013.01); *H01L 29/41775* (2013.01); *H01L 29/42356* (2013.01); *H01L 29/45* (2013.01); *H01L 29/66666* (2013.01)

(58) Field of Classification Search
None
See application file for complete search history.

(56) References Cited

U.S. PATENT DOCUMENTS 6,518,622 B1 * 2/2003 Chew ............... H01L 29/66666
                                                  257/135
6,903,411 B1 * 6/2005 Chyan ............. H01L 21/76895
                                                  257/327

(Continued)

FOREIGN PATENT DOCUMENTS

| JP | 2012004473 | 1/2012 |
|---|---|---|
| JP | 5662590 | 2/2015 |

OTHER PUBLICATIONS

Hergenrother, et al., "The Vertical Replacement-Gate (VRG) MOSFET: A 50-nm Vertical MOSFET with Lithography-Independent Gate Length", IEEE, IEDM 1999, pp. 75-78.*

*Primary Examiner* — Erik Kielin
(74) *Attorney, Agent, or Firm* — Onello & Mello, LLP

(57) ABSTRACT

A semiconductor device includes a semiconductor substrate including a first source/drain region formed in an upper portion of the semiconductor substrate, a metal silicide layer that covers a top surface of the first source/drain region, and a semiconductor pillar that penetrates the metal silicide layer and is connected to the semiconductor substrate. The semiconductor pillar includes a second source/drain region formed in an upper portion of the semiconductor pillar, a gate electrode on the metal silicide layer, with the gate electrode surrounding the semiconductor pillar in a plan view. A contact is connected to the metal silicide layer.

19 Claims, 16 Drawing Sheets

(51) Int. Cl.
*H01L 29/78* (2006.01)
*H01L 29/417* (2006.01)
*H01L 29/423* (2006.01)

(56) References Cited

U.S. PATENT DOCUMENTS

| | | |
|---|---|---|
| 8,138,048 B2 | 3/2012 | Masuoka et al. |
| 8,378,425 B2 | 2/2013 | Masuoka et al. |
| 8,536,645 B2 | 9/2013 | Henson et al. |
| 8,598,650 B2 | 12/2013 | Masuoka et al. |
| 8,723,252 B2 | 5/2014 | Sandhu et al. |
| 2009/0004797 A1 | 1/2009 | Lee |
| 2010/0187601 A1 | 7/2010 | Masuoka et al. |
| 2010/0207172 A1* | 8/2010 | Masuoka ........ H01L 21/823807 257/255 |
| 2015/0060996 A1* | 3/2015 | Colinge ................ H01L 29/775 257/329 |
| 2015/0090951 A1* | 4/2015 | Kim ................ H01L 29/66666 257/4 |
| 2015/0318290 A1* | 11/2015 | Liaw .................. H01L 27/1104 257/329 |
| 2016/0079391 A1* | 3/2016 | Boivin .............. H01L 29/66825 438/269 |

\* cited by examiner

VERTICAL TRANSISTOR HAVING A SEMICONDUCTOR PILLAR PENETRATING A SILICIDE FORMED ON THE SUBSTRATE SURFACE

CROSS-REFERENCE TO RELATED APPLICATIONS

This U.S. non-provisional patent application claims priority under 35 U.S.C. § 119 of Korean Patent Application 10-2016-0033520 filed on Mar. 21, 2016, the entire contents of which are hereby incorporated by reference.

BACKGROUND

Inventive concepts relate to a semiconductor device and, more particularly, to a semiconductor device having a transistor.

Semiconductor devices include integrated circuits having metal oxide semiconductor field effect transistors (MOSFETs). As sizes and design rules of the semiconductor devices are gradually decreased, sizes of the MOSFETs are also increasingly scaled down. The scaling down of MOSFETs may have negative effects on the operational characteristics of semiconductor devices. For example, the scaling down of MOSFETs may induce short channel effects. Accordingly, various methods have been developed to obtain semiconductor devices having superior performances while overcoming limitations due to integration of the semiconductor devices.

SUMMARY

Embodiments of the present inventive concept may provide a semiconductor apparatus with improved electrical characteristics.

According to exemplary embodiments of inventive concepts, a semiconductor device may comprise: a semiconductor substrate including a first source/drain region formed in an upper portion of the semiconductor substrate; a metal silicide layer that covers a top surface of the first source/drain region; a semiconductor pillar that penetrates the metal silicide layer and is connected to the semiconductor substrate, the semiconductor pillar including a second source/drain region formed in upper portion of the semiconductor pillar; a gate electrode on the metal silicide layer, the gate electrode surrounding the semiconductor pillar in a plan view; and a contact connected to the metal silicide layer.

According to exemplary embodiments of the present inventive concepts, a semiconductor device may comprise: a semiconductor substrate including a first source/drain region formed in an upper portion of the semiconductor substrate, the first source/drain region having a first conductivity; a semiconductor pillar connected to the semiconductor substrate; and a gate electrode on the first source/drain region, the gate electrode surrounding the semiconductor pillar in a plan view. The semiconductor pillar may comprise: a second source/drain region formed in an upper portion of the semiconductor pillar, the second source/drain region having the first conductivity; a sub-impurity region formed in a lower portion of the semiconductor pillar, the sub-impurity region having the first conductivity; and a channel region between the second source/drain region and the sub-impurity region, the channel region having a second conductivity different from the first conductivity.

According to exemplary embodiments, a semiconductor device, comprises a first source/drain region in an upper portion of a semiconductor substrate. A low-resistance layer is at a top surface of the first source/drain region. A semiconductor pillar extends through the low-resistance layer in a first direction of extension and is connected to the first source/drain region in the upper portion of the semiconductor substrate, the semiconductor pillar including a second source/drain region in an upper portion thereof. A gate electrode is on the metal silicide layer, the gate electrode surrounding the semiconductor pillar in a second direction transverse the first direction of extension. A contact is connected to the metal silicide layer.

BRIEF DESCRIPTION OF THE DRAWINGS

FIGS. 5A to 13A are plan views illustrating a method for manufacturing a semiconductor device according to exemplary embodiments of the present inventive concept.

FIGS. 5B to 13B are cross-sectional views taken along line I-I' of FIGS. 5A to 13A.

DETAILED DESCRIPTION OF EMBODIMENTS

Figure 1A:
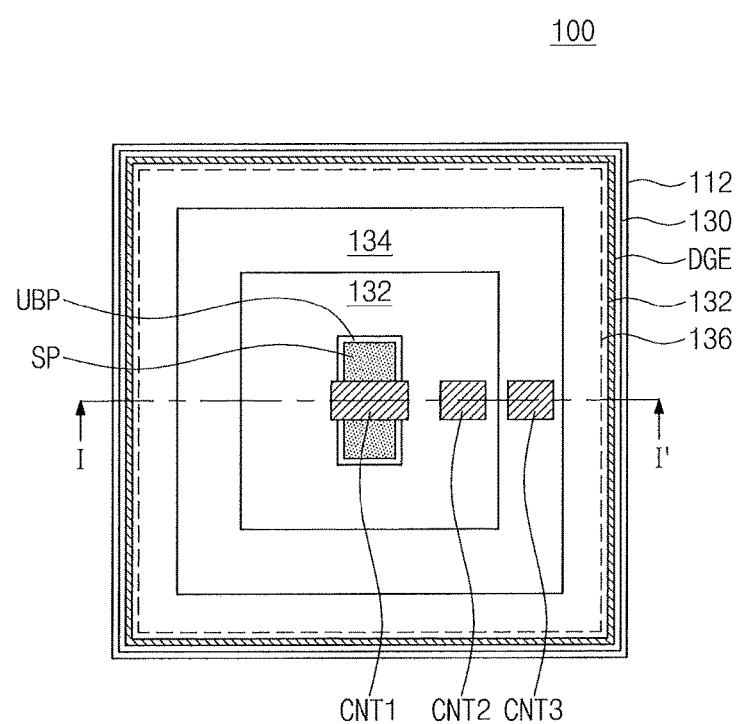
FIG. 1A is a plan view illustrating a semiconductor device according to exemplary embodiments of the present inventive concept.

Exemplary embodiments of aspects of the inventive concepts explained and illustrated herein include their complementary counterparts. The same reference numerals or the same reference designators denote the same elements throughout the specification.

In exemplary embodiments a metal silicide layer provides a low-resistance path between a contact and a semiconductor pillar that includes a second source/drain region, a channel region and a sub-impurity region. The sub-impurity region extends from a first source/drain region through the metal silicide layer and towards the second source/drain region, thereby reducing the channel length and resistance between the first and second source/drain regions. The sub-impurity region includes impurities of the same polarity as the first source/drain region, with a matching concentration at the interface between the two regions and a decreasing concentration as the distance from the interface increases.

Figure 1B:
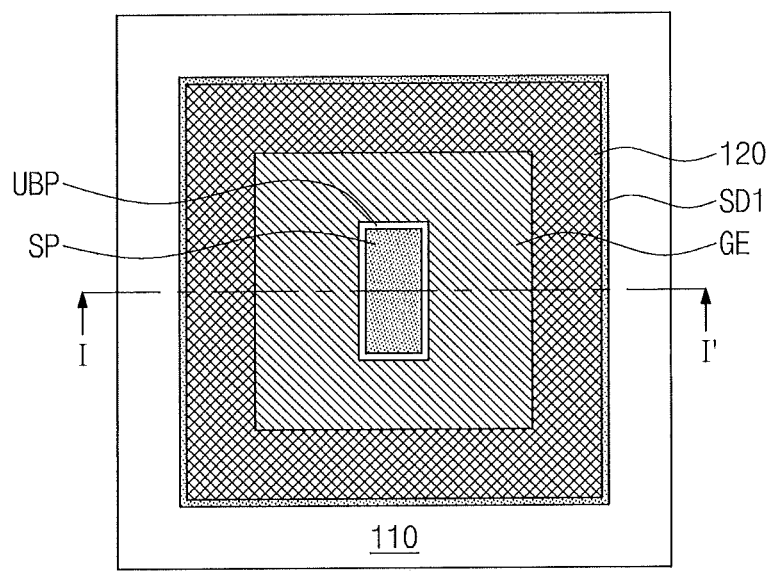
FIG. 1B is a plan view partly illustrating a semiconductor device according to exemplary embodiments of the present inventive concept.
Figure 1C:
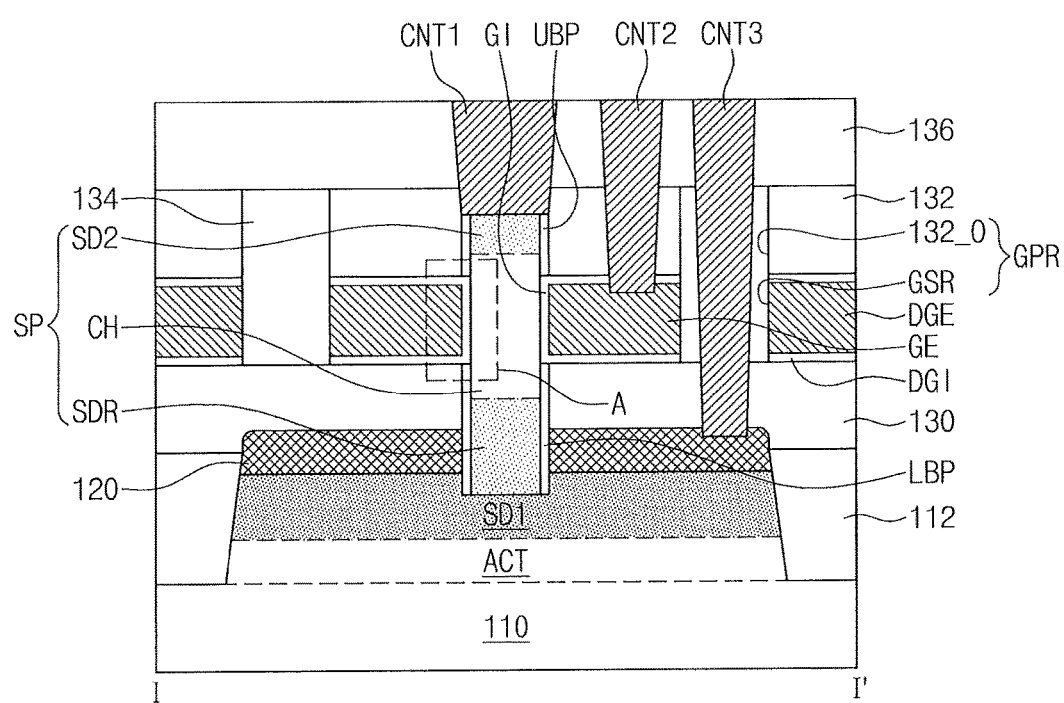
FIG. 1C is a cross-sectional view corresponding to line I-I' of FIG. 1A or 1B.
Figure 2:
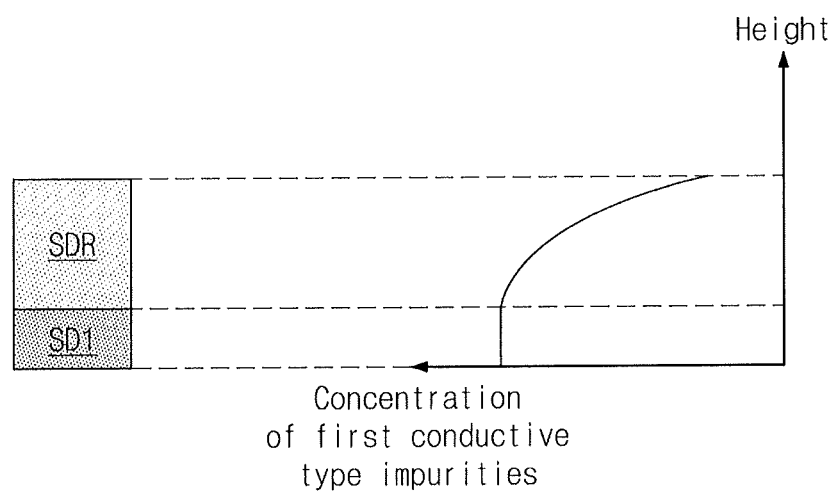
FIG. 2 is a graph illustrating a concentration variation of first conductive type impurities versus height in the first source/drain region and the sub-impurity region.
Figure 3A:
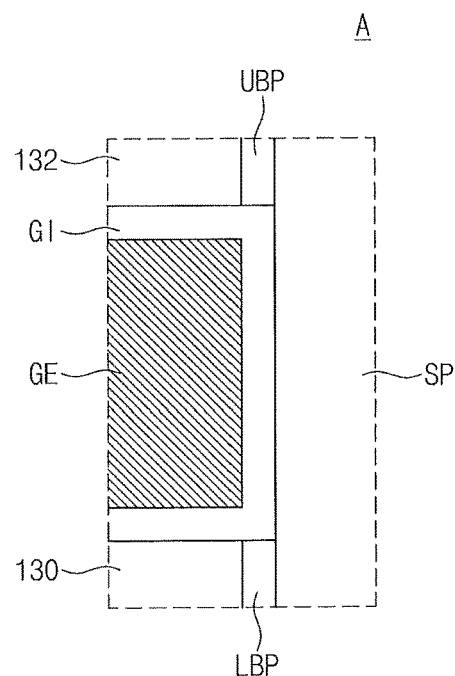
FIGS. 3A to 3C are an enlarged views illustrating section A of FIG. 1C, respectively.
Figure 3B:
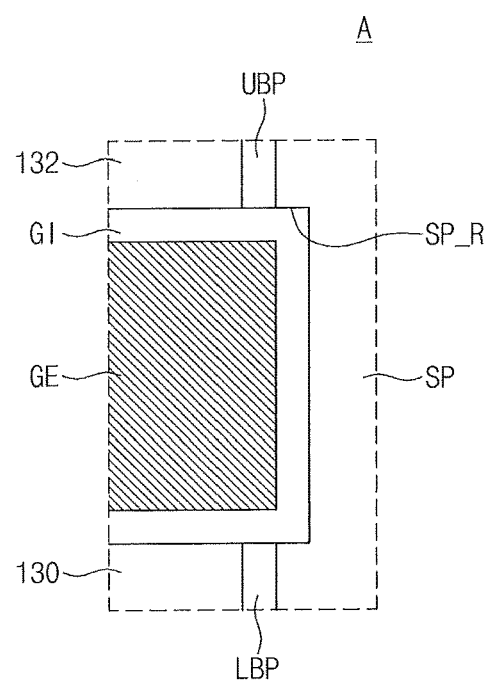
Figure 3C:
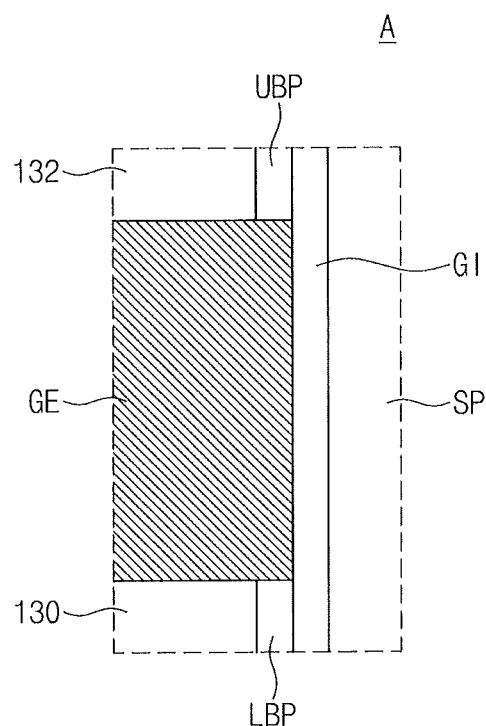

FIG. 1A is a plan view illustrating a semiconductor device according to exemplary embodiments of the present inventive concept. FIG. 1B is a plan view partly illustrating a semiconductor device according to exemplary embodiments of the present inventive concept. For example, FIG. 1B is a plan view illustrating a semiconductor substrate, a first source/drain region, a metal silicide layer, a semiconductor pillar, an upper diffusion barrier pattern, and a gate electrode selected from elements of the semiconductor device of FIG. 1A. FIG. 1C is a cross-sectional view corresponding to line I-I' of FIG. 1A or 1B. FIG. 2 is a graph illustrating a concentration variation of first conductive type impurities versus height in a first source/drain region and a sub-impurity region. FIGS. 3A to 3C are enlarged views illustrating section A of FIG. 1C.

Referring to FIGS. 1A to 1C, a device isolation layer 112 may be provided on a semiconductor substrate 110 to define an active region ACT of the semiconductor substrate 110. For example, as viewed in plan, the active region ACT may be a portion of the semiconductor substrate 110 that is surrounded by the device isolation layer 112. The semiconductor substrate 110 may be, for example, a silicon substrate or a silicon on insulator (SOI) substrate. The device isolation layer 112 may include silicon oxide and may be formed by, for example, a shallow trench isolation (STI) process.

The active region ACT may include a first source/drain region SD1 formed in an upper portion thereof. The first source/drain region SD1 may be formed to have a predetermined depth from a top surface of the active region ACT, for example. The first source/drain region SD1 may be a region having a first conductivity, which may include highly doped first conductive type impurities. In some embodiments, as shown in FIGS. 1B and 1C, the first source/drain region SD1 may be formed in the entirety of the upper portion of the active region ACT.

A metal silicide layer 120 may be provided on the active region ACT. The metal silicide layer 120 may cover the top surface of the active region ACT (or, a top surface of the first source/drain region SD1) and may not extend onto the device isolation layer 112. The metal silicide layer 120 may have a bottom surface in contact with the top surface of the active region ACT (or, the top surface of the first source/drain region SD1). The metal silicide layer 120 may have resistivity less than that of the first source/drain region SD1. The metal silicide layer 120 may include, for example, cobalt silicide or nickel silicide.

A first interlayer dielectric layer 130 may be provided on the metal silicide layer 120. The first interlayer dielectric layer 130 may cover a top surface of the device isolation layer 112 and a top surface of the metal silicide layer 120. The first interlayer dielectric layer 130 may include, for example, silicon oxide.

A semiconductor pillar SP may be provided to penetrate the metal silicide layer 120 and connect to the semiconductor substrate 110. The semiconductor pillar SP may extend in a direction substantially vertical to a top surface of the semiconductor substrate 110 and penetrate the first interlayer dielectric layer 130. The semiconductor pillar SP may partially protrude above the first interlayer dielectric layer 130. In some exemplary embodiments, as shown in FIG. 1C, the semiconductor pillar SP may have a bottom surface positioned in the first source/drain region SD1 and, thus, the bottom surface of the semiconductor pillar SP may be positioned below the top surface of the first source/drain region SD1, but inventive concepts are not limited thereto. In FIGS. 1A and 1B, the semiconductor pillar SP has a rectangular planar shape, but inventive concepts are not limited thereto. For example, the semiconductor pillar SP may have various planar shapes (e.g., circle, ellipse, or polygon). The semiconductor pillar SP may be, for example, an epitaxial layer grown from the semiconductor substrate 110 serving as a seed layer.

The semiconductor pillar SP may include a second source/drain region SD2 formed in an upper portion thereof, a sub-impurity region SDR formed in a lower portion thereof, and a channel region CH between the second source/drain region SD2 and the sub-impurity region SDR.

The second source/drain region SD2 may be formed to have a predetermined depth from a top surface of the semiconductor pillar SP. The second source/drain region SD2 may be a region having the first conductivity, which may include highly doped first conductive type impurities, for example.

The sub-impurity region SDR may be formed to have a predetermined depth from the bottom surface of the semiconductor pillar SP. The sub-impurity region SDR may be a region having the first conductivity, which may include first conductive type impurities, for example.

Referring further to FIG. 2, in exemplary embodiments the concentration of the first conductive type impurities may be less in the sub-impurity region SDR than in the first source/drain region SD1. The sub-impurity region SDR may have a concentration profile where the concentration of the first conductive type impurities decreases with increasing distance from the bottom surface of the sub-impurity region SDR. In detail, the first source/drain region SD1 and the sub-impurity region SDR may have the same, or substantially the same, concentration of the first conductive type impurities at an interface therebetween, with the concentration of the first conductive type impurities decreasing with increasing distance from the interface, as illustrated, for example, in the graphical representation of FIG. 2.

The sub-impurity region SDR may have a top surface positioned higher than the top surface of the first source/drain region SD1. In some embodiments, as shown in FIG. 1C, the top surface of the sub-impurity region SDR may be positioned higher than the top surface of the metal silicide layer 120.

The channel region CH may be positioned between the second source/drain region SD2 and the sub-impurity region SDR. The channel region CH may be a region having a second conductivity different from the first conductivity. For example, the second conductivity may be p-type if the first conductivity is n-type, or the second conductivity may be n-type if the first conductivity is p-type. The channel region CH may include, for example, lowly doped second conductive type impurities. In exemplary embodiments, the concentration of the second conductive type impurities included in the channel region CH may be less than that of the first conductive type impurities included in each of the first source/drain region SD1 and the second source/drain region SD2.

A gate electrode GE may be provided on the first interlayer dielectric layer 130. The gate electrode GE may surround a portion of the semiconductor pillar SP that protrudes above the first interlayer dielectric layer 130 in an area of the semiconductor pillar SP that coincides with, or overlaps, the channel region CH, and thereby the gate electrode GE may overlap at least a portion of the channel region CH. As viewed in plan, the gate electrode GE may overlap the metal silicide layer 120 and the gate electrode GE may have an area less than that of the metal silicide layer 120. The gate electrode GE may include at least one of: doped silicon, conductive metal nitride (e.g., titanium nitride, tantalum nitride, etc.), and metal (e.g., aluminum, tungsten, copper, etc.), for example.

In some exemplary embodiments, as shown in FIG. 1C, a dummy gate electrode DGE may be provided on the first interlayer dielectric layer 130. The dummy gate electrode DGE may surround the gate electrode GE and be spaced apart from the gate electrode GE. A gate separation region GSR may be defined to correspond to a region between the gate electrode GE and the dummy gate electrode DGE. The dummy gate electrode DGE may include at least one of:

doped silicon, conductive metal nitride (e.g., titanium nitride, tantalum nitride, etc.), and metal (e.g., aluminum, tungsten, copper, etc.).

In exemplary embodiments, unlike that shown in FIG. 1C, the dummy gate electrode DGE may not be provided. In such exemplary embodiments, an additional insulation layer may take place of the dummy gate electrode DGE of FIG. 1C. The additional insulation layer may include, for example, silicon oxide.

In exemplary embodiments a second interlayer dielectric layer 132 may be provided to cover the gate electrode GE and a portion of a sidewall of the semiconductor pillar SP that protrudes above the gate electrode GE. In exemplary embodiments in which the dummy gate electrode DGE is provided, the second interlayer dielectric layer 132 may also be provided on the dummy gate electrode DGE. In exemplary embodiments in which the additional insulation layer is provided in place of the dummy gate electrode DGE, the second interlayer dielectric layer 132 may also be provided on the additional insulation layer. The second interlayer dielectric layer 132 may include an opening 132_O that vertically corresponds to the gate separation region GSR. A gap region GPR may then be defined to include the gate separation region GSR and the opening 132_O of the second interlayer dielectric layer 132. The second interlayer dielectric layer 132 may include, for example, silicon oxide.

A filling insulation layer 134 may be provided to fill the gap region GPR. The filling insulation layer 134 may include, for example, silicon oxide.

A lower diffusion barrier pattern LBP may be provided to surround a lower sidewall of the semiconductor pillar SP. The lower diffusion barrier pattern LBP may be interposed between the semiconductor pillar SP (or the sub-impurity region SDR) and the metal silicide layer 120, such that the semiconductor pillar SP may be spaced apart from the metal silicide layer 120. In other words, the semiconductor pillar SP may be horizontally spaced apart from the metal silicide layer 120 with the lower diffusion barrier pattern LBP interposed therebetween. In exemplary embodiments the lower diffusion barrier pattern LBP may extend between the semiconductor pillar SP and the first interlayer dielectric layer 130 but not extend between the semiconductor pillar SP and the gate electrode GE. The lower diffusion barrier pattern LBP may have a bottom surface whose level is substantially the same as that of the bottom surface of the semiconductor pillar SP. In some embodiments, as shown in FIG. 1C, the bottom surface of the lower diffusion barrier pattern LBP may be positioned in the first source/drain region SD1. In such exemplary embodiments, the bottom surface of the lower diffusion barrier pattern LBP may be positioned below the bottom surface of the metal silicide layer 120, but inventive concepts are not limited thereto. The lower diffusion barrier pattern LBP may include, for example, at least one of: silicon nitride, silicon oxynitride (SiON), silicon carbonitride (SiCN), and silicon oxycarbonitride (SiOCN).

An upper diffusion barrier pattern UBP may be provided to surround an upper sidewall of the semiconductor pillar SP. The upper diffusion barrier pattern UBP may be interposed between the semiconductor pillar SP and the second interlayer dielectric layer 132, In exemplary embodiments, upper diffusion barrier pattern UBP may not extend between the semiconductor pillar SP and the gate electrode GE, The upper diffusion barrier pattern UBP may include, for example, at least one of: silicon nitride, silicon oxynitride (SiON), silicon carbonitride (SiCN), and silicon oxycarbonitride (SiOCN).

A gate dielectric layer GI may be interposed between the gate electrode GE and the semiconductor pillar SP, The gate dielectric layer GI may include at least one of: high-k dielectric materials such as aluminum oxide, hafnium oxide, zirconium oxide, hafnium silicate, or zirconium silicate.

In some exemplary embodiments, such as shown in FIG. 1C, the gate dielectric layer GI may extend onto top and bottom surfaces of the gate electrode GE. In embodiments in which the dummy gate electrode DGE is provided as shown in FIG. 1C, a dummy gate dielectric layer DGI may be provided on top and bottom surfaces of the dummy gate electrode GE.

In exemplary embodiments in which the gate dielectric layer GI extends onto the top and bottom surfaces of the gate electrode GE, such as shown in FIG. 3A, the semiconductor pillar SP may have no recess region on its sidewall that horizontally corresponds to the gate electrode GE.

In other exemplary embodiments in which the gate dielectric layer GI extends onto the top and bottom surfaces of the gate electrode GE, such as shown in FIG. 3B, the semiconductor pillar SP may include a recess region SP_R at its sidewall that horizontally corresponds to the gate electrode GE. In such embodiments, the gate dielectric layer GI may be formed to conform to the recess region SP_R.

In exemplary embodiments, unlike that shown in FIG. 1C, the gate dielectric layer GI may extend along the sidewall of the semiconductor pillar SP as illustrated in FIG. 3C. In such exemplary embodiments, unlike that shown in FIG. 1C, the dummy gate dielectric layer DGI may not be provided on the top and bottom surfaces of the dummy gate electrode DGE.

Referring back to FIG. 1C, a third interlayer dielectric layer 136 may be provided on the second interlayer dielectric layer 132. The third interlayer dielectric layer 136 may cover the top surface of the semiconductor pillar SP. The third interlayer dielectric layer 136 may include, for example, silicon oxide.

A first contact CNT1 may be provided to penetrate the third interlayer dielectric layer 136 and may be connected to the second source/drain region SD2. A second contact CNT2 may be provided to penetrate the third and second interlayer dielectric layers 136 and 132 and may be connected to the gate electrode GE. A third contact CNT3 may be provided to penetrate the third interlayer dielectric layer 136, the filing insulation layer 134, and the first interlayer dielectric layers 130 and may be connected to the metal silicide layer 120. Each of the first to third contacts CNT1, CNT2 and CNT3 may include a barrier layer and a metal layer. The barrier layer may include, for example, at least one of: titanium nitride, tantalum nitride, tungsten nitride, hafnium nitride, and zirconium nitride. The metal layer may include, for example, at least one of: tungsten, copper, titanium, tantalum, aluminum, and platinum.

According to exemplary embodiments, the first source/drain region SD1 may be covered by the metal silicide layer 120 having a relatively low resistivity. The metal silicide layer 120 may be electrically connected to the third contact CNT3 and horizontally extend to be adjacent to the semiconductor pillar SP. Accordingly, a relatively low resistance may be achieved between the third contact CNT3 and the semiconductor pillar SP, compared with a case where the metal silicide layer 120 is not provided or is formed locally on a lower portion of the third contact CNT3.

According to exemplary embodiments, the sub-impurity region SDR may be formed in a lower portion of the semiconductor pillar SP. The sub-impurity region SDR may have the same conductivity as the first source/drain region SD1 and may be connected to the first source/drain region SD1. The sub-impurity region SDR may then serve as an extension of the first source/drain region SD1 and thereby reduce the length of the channel region CH. As a result, according to exemplary embodiments, a relatively low resistance may be achieved between the first and second source/drain regions SD1 and SD2 and semiconductor device 100 may be provided to have improved electrical characteristics.

That is, in exemplary embodiments in accordance with principles of inventive concepts, a metal silicide layer provides a low-resistance path between a contact and a semiconductor pillar that includes a second source/drain region, a channel region and a sub-impurity region. The sub-impurity region extends from a first source/drain region through the metal silicide layer and towards the second source/drain region, thereby reducing the channel length and resistance between the first and second source/drain regions. The sub-impurity region includes impurities of the same polarity as the first source/drain region, with a matching concentration at the interface between the two regions and a decreasing concentration as the distance from the interface increases.

Figure 4:
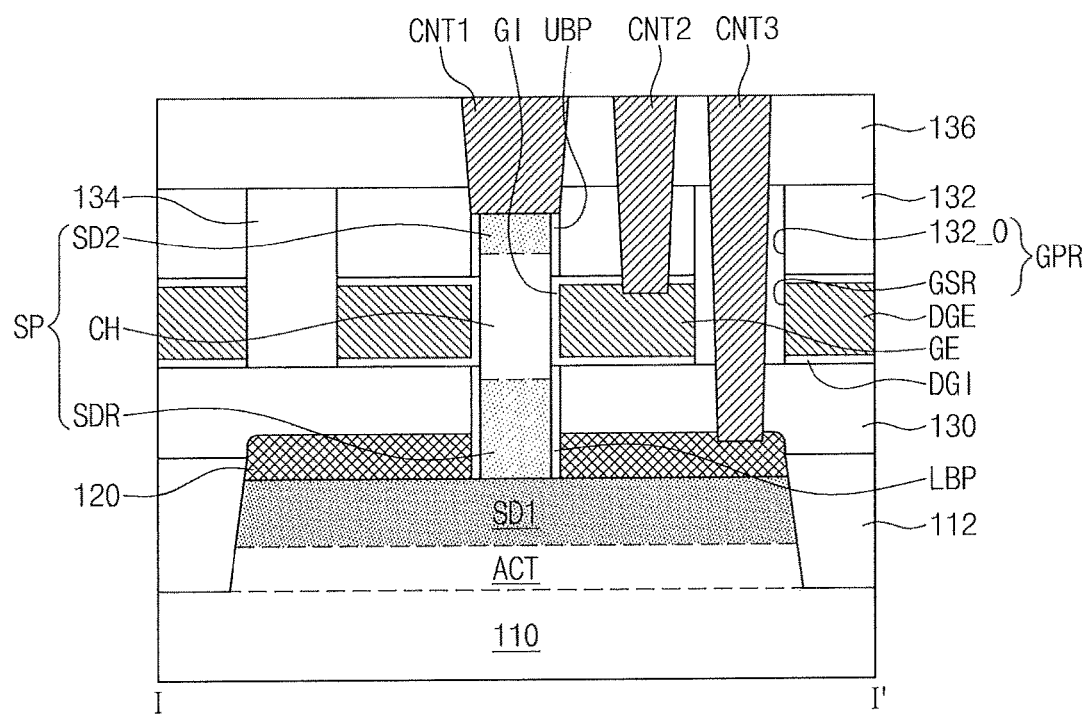
FIG. 4 is a cross-sectional view illustrating a semiconductor device according to exemplary embodiments of the present inventive concept.

FIG. 4 is a cross-sectional view illustrating a semiconductor device according to exemplary embodiments of inventive concepts. FIG. 4 may be a cross-sectional view corresponding to lines I-I' of FIG. 1A or 1B, for example.

Referring to FIG. 4, a semiconductor device 101 may be provided. Parts of the present embodiment configuration substantially the same as or similar to those of the semiconductor device 100 discussed with reference to FIGS. 1A to 1C, 2, and 3A to 3C are allocated to have the same reference numerals, and repetitive explanations thereof will be omitted. Hereinafter, the semiconductor pillar SP and the lower diffusion barrier pattern LBP may be selectively explained in detail and explanations of other elements may be substantially the same as those discussed with reference to FIGS. 1A to 1C, 2, and 3A to 3C.

The semiconductor pillar SP may penetrate the metal silicide layer 120 and may be connected to the semiconductor substrate 110. The semiconductor pillar SP may extend substantially vertically to the top surface of the semiconductor substrate 110 and penetrate the first interlayer dielectric layer 130. A portion of the semiconductor pillar SP may protrude above the first interlayer dielectric layer 130. The bottom surface of the semiconductor pillar SP may be positioned at the same level as that of the top surface of the semiconductor substrate 110 or the top surface of the first source/drain region SD1.

The semiconductor pillar SP may include the second source/drain region SD2 formed in its upper portion, the sub-impurity region SDR formed in its lower portion, and the channel region CH between the second source/drain region SD2 and the sub-impurity region SDR.

The second source/drain region SD2 may be a region having a first conductivity and may have highly doped first conductive type impurities, for example.

The sub-impurity region SDR may be a region having the first conductivity and may include first conductive type impurities, for example. In exemplary embodiments, as discussed with reference to FIG. 2, the sub-impurity region SDR may have a concentration profile in which the concentration of the first conductive type impurities decreases with increasing distance from the bottom surface of the sub-impurity region SDR.

The channel region CH may be positioned between the second source/drain region SD2 and the sub-impurity region SDR. The channel region CH may be a region having a second conductivity different from the first conductivity and may include lowly doped second conductive type impurities, for example. In exemplary embodiments, a concentration of the second conductive type impurities included in the channel region CH may be less than that of the first conductive type impurities included in each of the first source/drain region SD1 and the second source/drain region SD2.

The lower diffusion barrier pattern LBP may be provided on the lower sidewall of the semiconductor pillar SP. The lower diffusion barrier pattern LBP may be interposed between the semiconductor pillar SP (or the sub-impurity region SDR) and the metal silicide layer 120, such that the semiconductor pillar SP may be spaced apart from the metal silicide layer 120. The bottom surface of the lower diffusion barrier pattern LBP may be positioned at substantially the same level as the bottom surface of the semiconductor pillar SP. Therefore, as shown in FIG. 4, the bottom surface of the lower diffusion barrier pattern LBP may be positioned at substantially the same level as the top surface of the first source/drain region SD1.

According to exemplary embodiments, the first source/drain region SD1 may be covered by the metal silicide layer 120 having a relatively low resistivity. The metal silicide layer 120 may be electrically connected to the third contact CNT3 and horizontally extend to be adjacent to the semiconductor pillar SP. As a result, a relatively low resistance may be achieved between the third contact CNT3 and the semiconductor pillar SP, compared with a case where the metal silicide layer 120 is not provided or is formed locally on a lower portion of the third contact CNT3.

According to exemplary embodiments, the sub-impurity region SDR may be formed in the lower portion of the semiconductor pillar SP. The sub-impurity region SDR may have the same conductivity as the first source/drain region SD1 and be connected to the first source/drain region SD1. The sub-impurity region SDR may then serve as an extension of the first source/drain region SD1 and reduce the length of the channel region CH. Therefore, according to exemplary embodiments, a relatively low resistance may be achieved between the first and second source/drain regions SD1 and SD2 and the semiconductor device 101 may be provided to have improved electrical characteristics.

FIGS. 5A to 13A are plan views illustrating a method for manufacturing a semiconductor device according to exemplary embodiments of inventive concepts. FIGS. 5B to 13B are cross-sectional views taken along line I-I' of FIGS. 5A to 13A. Elements of the present embodiment substantially same as, or similar to, those of the semiconductor device 100 discussed with reference to FIGS. 1A to 1C, 2, and 3A to 3C are allocated to have the same reference numerals, and repetitive explanations thereof will be omitted.

Figure 5A:
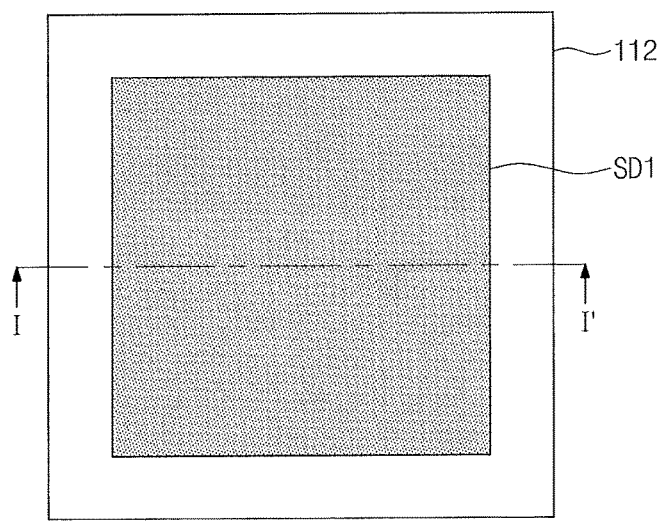
Figure 5B:
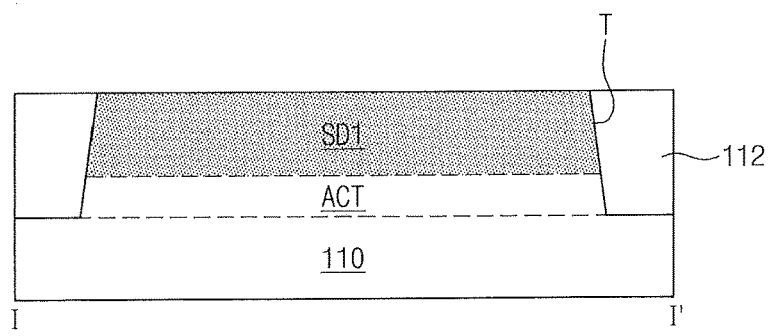

Referring to FIGS. 5A and 5B, a semiconductor substrate 110 may be provided. The semiconductor substrate 110 may be, for example, a silicon substrate or a silicon-on-insulator (SOI) substrate.

A device isolation layer 112 may be formed on the semiconductor substrate 110 to define an active region ACT thereof. The device isolation layer 112 may be formed by a shallow trench isolation (STI) process. In exemplary embodiments, the formation of the device isolation layer 112 may include forming a trench T to define the active region ACT, forming an insulation layer to fill the trench T, and planarizing the insulation layer.

A first source/drain region SD1 may be formed to have a first conductivity in an upper portion of the active region ACT. The first source/drain region SD1 may be formed by, for example, performing an ion implantation to implant first conductive type impurities into an entire surface of the semiconductor substrate 110 on which the device isolation layer 112 is formed.

Figure 6A:
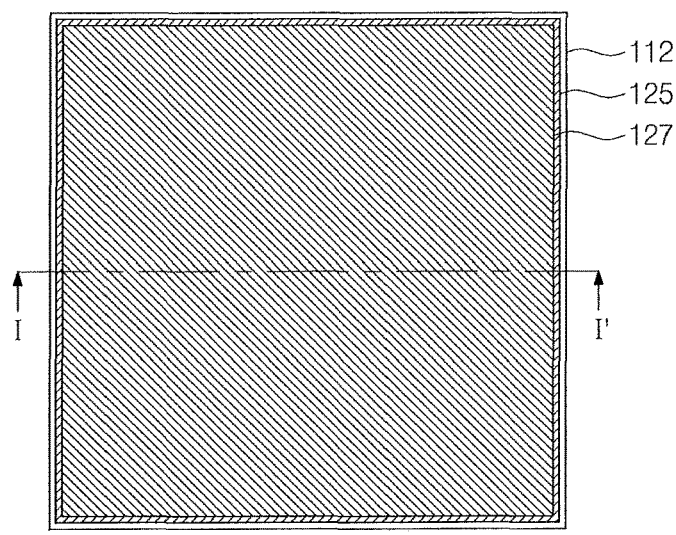
Figure 6B:
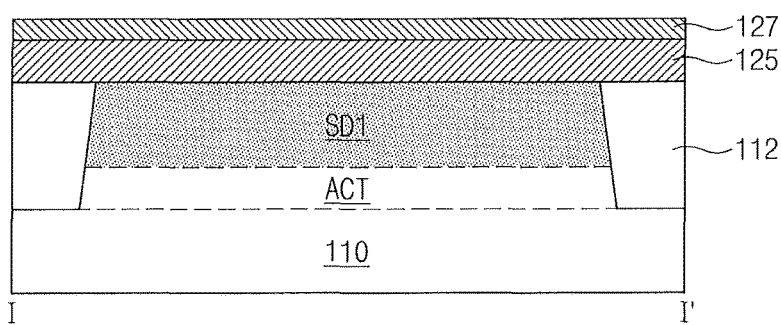

Referring to FIGS. 6A and 6B, a metal layer 125 may be formed on the entire surface of the semiconductor substrate 110. The metal layer 125 may cover a top surface of the active region ACT (or a top surface of the first source/drain region SD1) and additionally cover a top surface of the device isolation layer 112. The metal layer 125 may be formed using, for example, a chemical vapor deposition (CVD) or a physical vapor deposition (PVD) process. The metal layer 125 may include, for example, cobalt or nickel.

A metal nitride layer 127 may be formed on the metal layer 125. The metal nitride layer 127 may be formed using, for example, a chemical vapor deposition (CVD) or a physical vapor deposition (PVD) process. The metal nitride layer 127 may include, for example, titanium nitride. In some exemplary embodiments, unlike that shown in FIGS. 6A and 6B, the formation of the metal nitride layer 127 may be skipped.

Figure 7A:
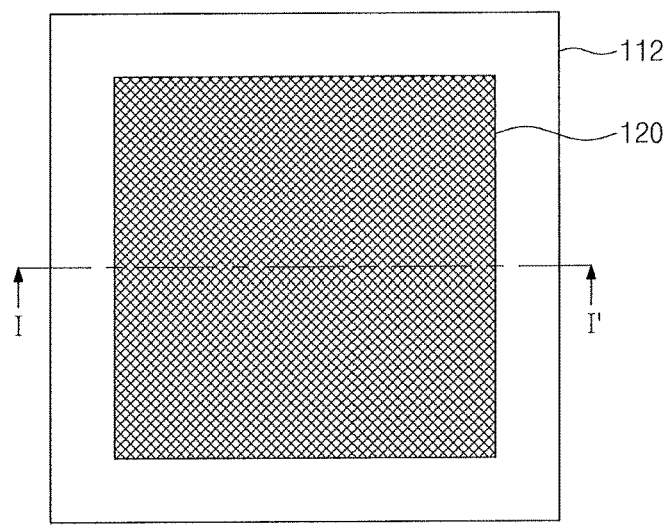
Figure 7B:
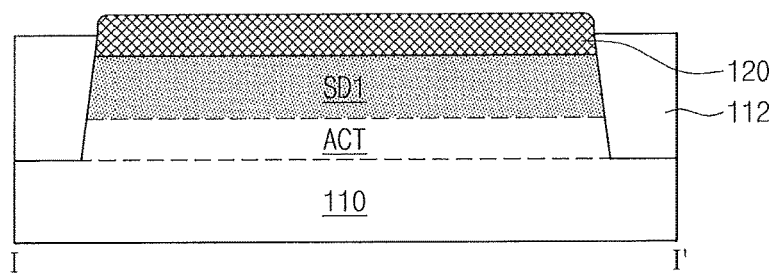

Referring to FIGS. 7A and 7B, a metal silicide layer 120 may be formed to cover the top surface of the active region ACT (or the top surface of the first source/drain region SD1). The formation of the metal silicide layer 120 may include performing a heat treatment (e.g., rapid thermal annealing (RTA)) on the semiconductor substrate 110 on which the metal layer 125 is formed. The heat treatment may allow the metal layer 125 to react with the upper portion of the active region ACT such that the metal silicide layer 120 may be formed. The metal layer 125 may not react with the device isolation layer 112. Accordingly, the metal silicide layer 120 may be formed locally on the active region ACT. The metal nitride layer 127 may serve to protect the metal layer 125 during the formation of the metal silicide layer 120. After the metal silicide layer 120 is formed, a removal process may be performed to remove the metal nitride layer 127 and a remaining metal layer 125 that has not reacted with the upper portion of the active region ACT.

Figure 8A:
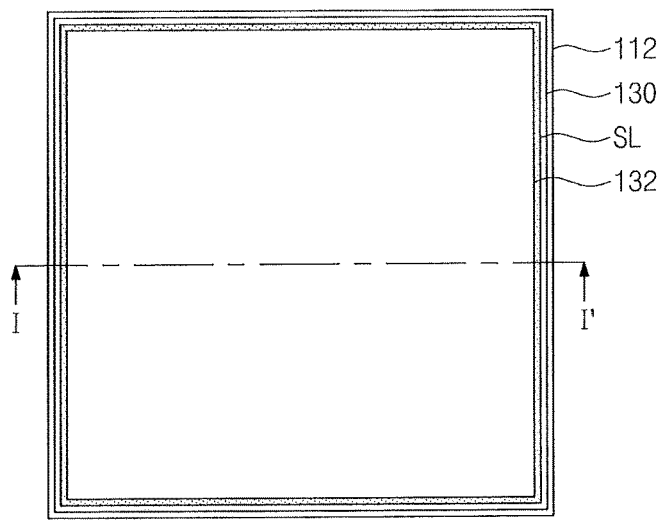
Figure 8B:
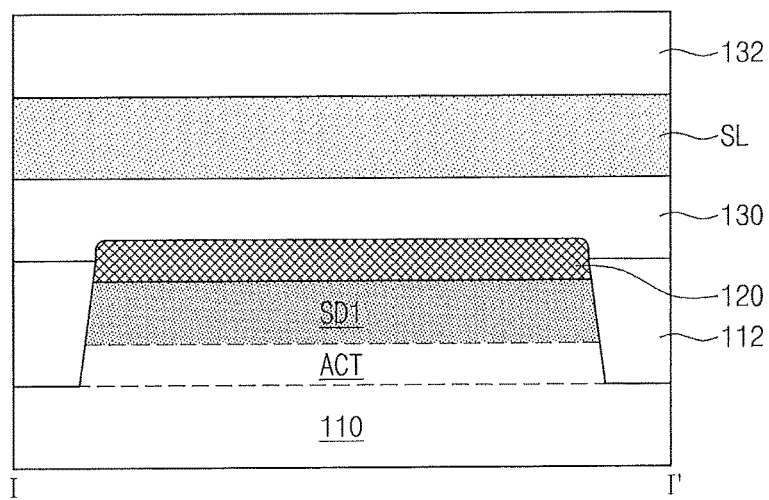

Referring to FIGS. 8A and 8B, a first interlayer dielectric layer 130, a sacrificial layer SL, and a second interlayer dielectric layer 132 may be sequentially formed on the entire surface of the semiconductor substrate 110 on which the metal silicide layer 120 is formed. The sacrificial layer SL may have an etch selectivity with respect to the first and second interlayer dielectric layers 130 and 132. For example, the sacrificial layer SL may include silicon nitride, and the first and second interlayer dielectric layers 130 and 132 may include silicon oxide. Each of the first interlayer dielectric layer 130, the sacrificial layer SL, and the second interlayer dielectric layer 132 may be formed using, for example, a chemical vapor deposition (CVD) or a physical vapor deposition (PVD) process.

Figure 9A:
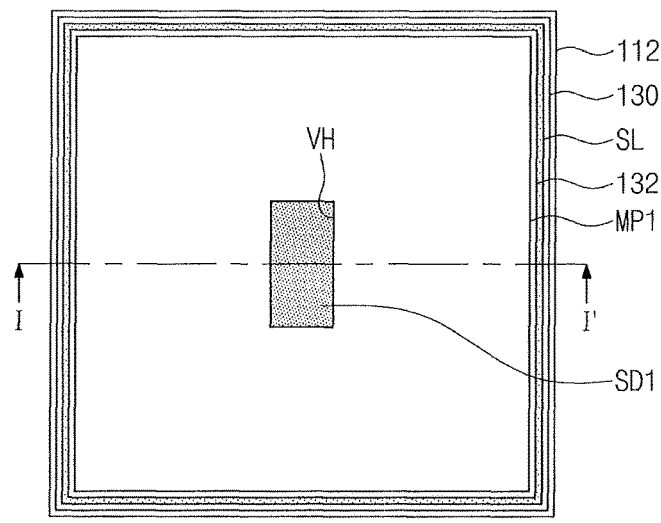
Figure 9B:
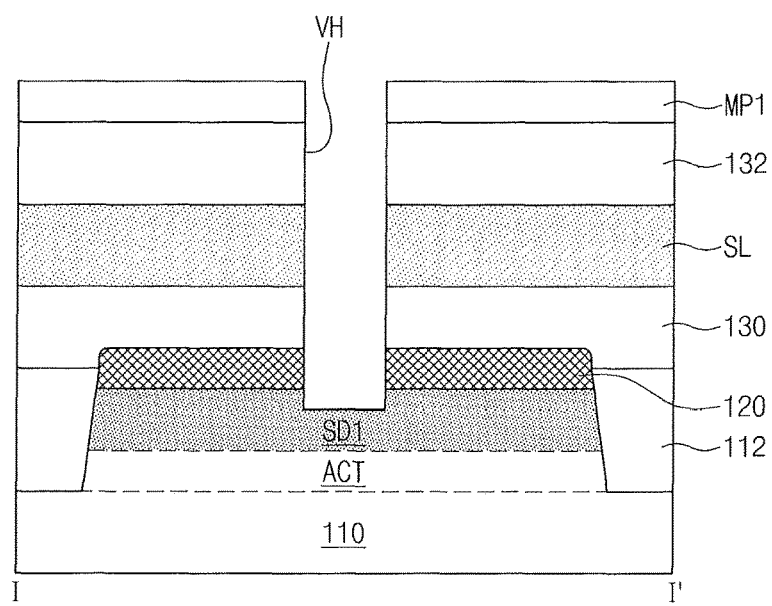

Referring to FIGS. 9A and 9B, a vertical hole VH may be formed to penetrate the metal silicide layer 120, the first interlayer dielectric layer 130, the sacrificial layer SL, and the second interlayer dielectric layer 132. The semiconductor substrate 110 may be exposed through a floor surface of the vertical hole VH. The formation of the vertical hole VH may include forming a first mask pattern MP1 on the second interlayer dielectric layer 131 and sequentially etching (e.g., an anisotropic etch) the second interlayer dielectric layer 132, the sacrificial layer SL, the first interlayer dielectric layer 130, and the metal silicide layer 120 using the first mask pattern MP1 as an etch mask.

In some exemplary embodiments, as shown in FIG. 9B, the floor surface of the vertical hole VH may be positioned in the first source/drain region SD1. In other words, an upper portion of the first source/drain region SD1 may be recessed by the process for forming the vertical hole VH. These embodiments may be employed to fabricate the semiconductor device 100 discussed with reference to FIG. 1C.

In some exemplary embodiments, unlike that shown in FIG. 9B, the floor surface of the vertical hole VH may be positioned at the substantially same level as the top surface of the first source/drain region SD1. In other words, the upper portion of the first source/drain region SD1 may not be substantially recessed by the process for forming the vertical hole VH. These embodiments may be employed to fabricate the semiconductor device 101 discussed with reference to FIG. 4.

Figure 10A:
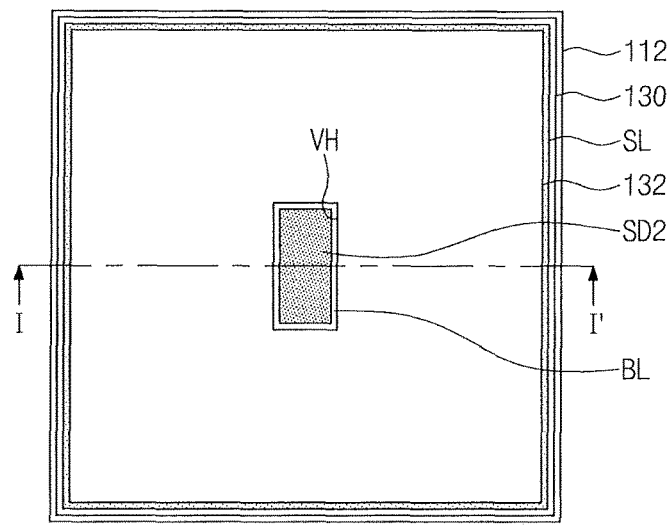
Figure 10B:
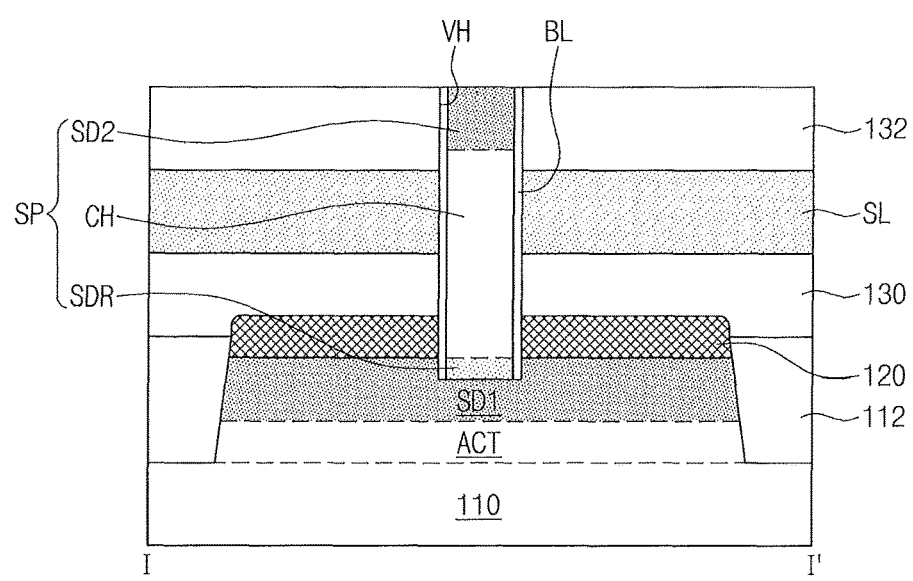

Referring to FIGS. 10A and 10B, a diffusion barrier layer BL may be formed to conformally cover a sidewall of the vertical hole VH. The formation of the diffusion barrier layer BL may include forming a preliminary diffusion barrier layer (not shown) to conformally cover the vertical hole VH and etching (e.g., an anisotropic etch) the preliminary diffusion barrier layer. The preliminary diffusion barrier layer may be formed using, for example, a chemical vapor deposition (CVD) or an atomic layer deposition (ALD) process. The etching of the preliminary diffusion barrier layer may expose the floor surface (or the semiconductor substrate 110) of the vertical hole VH.

A semiconductor pillar SP may be formed to fill the vertical hole VH. The semiconductor pillar SP may have a second conductivity different from the first conductivity. The formation of the semiconductor pillar SP may include performing an epitaxial growth process where the semiconductor substrate 110 exposed through the floor surface of the vertical hole VH is used as a seed layer and performing a planarization process until a top surface of the second interlayer dielectric layer 132 is exposed. Second conductive type impurities may be doped in-situ during the epitaxial growth process.

In some exemplary embodiments, before forming the semiconductor pillar SP, a process may be further performed to form a gate dielectric layer (not shown) on the diffusion barrier layer BL. Such exemplary embodiments may be employed to fabricate the semiconductor device discussed with reference to FIG. 3C, for example.

In some exemplary embodiments, before forming the semiconductor pillar SP, the gate dielectric layer (not shown) may not be formed on the diffusion barrier layer BL. Such exemplary embodiments may be employed to fabricate the semiconductor device discussed with reference to FIGS. 3A and 3B, for example.

A second source/drain region SD2 may be formed in an upper portion of the semiconductor pillar SP. The second source/drain region SD2 may have the first conductivity. The formation of the second source/drain region SD2 may include performing an ion implantation to implant first conductive type impurities into the entire surface of the semiconductor substrate 110 on which the semiconductor pillar SP is formed.

According to embodiments in which the semiconductor pillar SP has a bottom surface in contact with the first source/drain region SD1, as shown in FIG. 10B, a sub-impurity region SDR having the first conductivity may be formed in a lower portion of the semiconductor pillar SP. The sub-impurity region SDR may be formed by diffusion of the first conductive type impurities included in the first source/drain region SD1. For example, the semiconductor substrate 110 may be provided with heat during the process for forming the second source/drain region SD2, and the heat may promote the first conductive type impurities to diffuse into the lower portion of the semiconductor pillar SP from the first source/drain region SD1. Such exemplary embodiments may be employed to fabricate the semiconductor device discussed with reference to FIG. 1C or 4, for example.

Figure 11A:
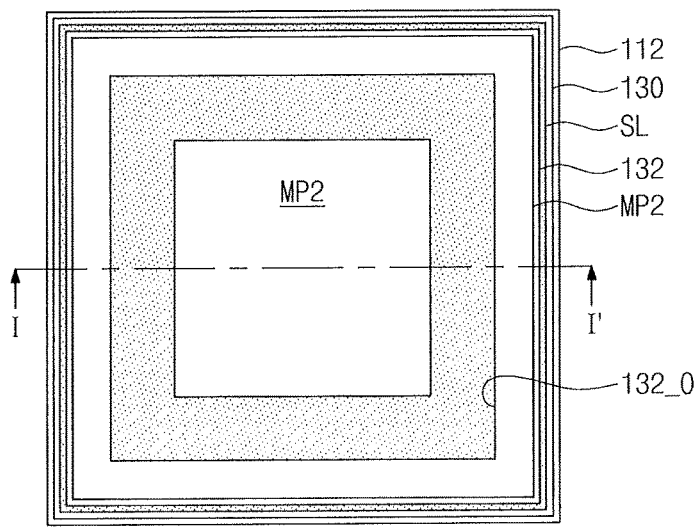
Figure 11B:
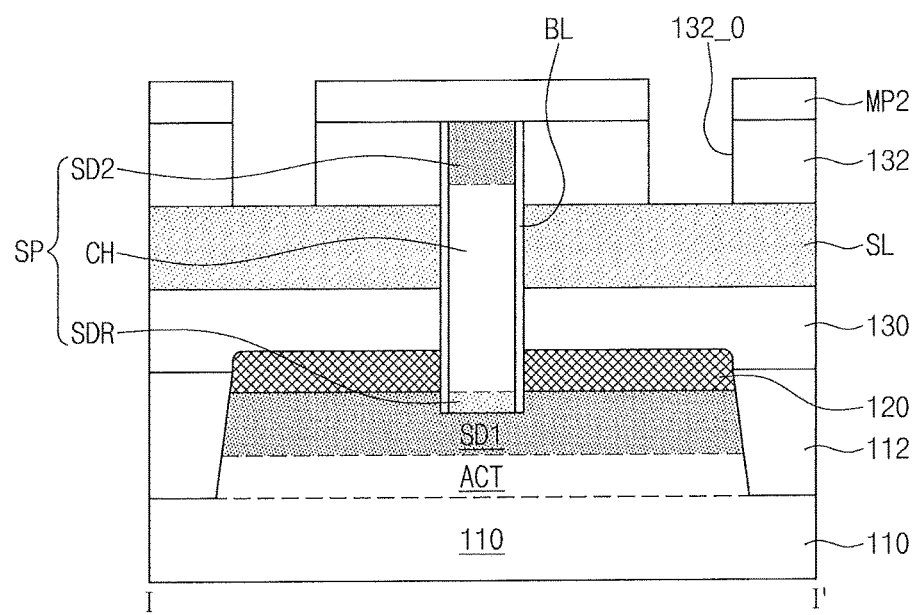

Referring to FIGS. 11A and 11B, an opening 132_O may be formed to penetrate the second interlayer dielectric layer 132. The sacrificial layer SL may be exposed through the opening 132_O. As viewed in plan, the opening 132_O may be formed to enclose the semiconductor pillar SP while being spaced apart therefrom. The formation of the opening 132_O may include forming a second mask pattern MP2 on the second interlayer dielectric layer 132 and etching the second interlayer dielectric layer 132 using the second mask pattern MP2 as an etch mask.

Figure 12A:
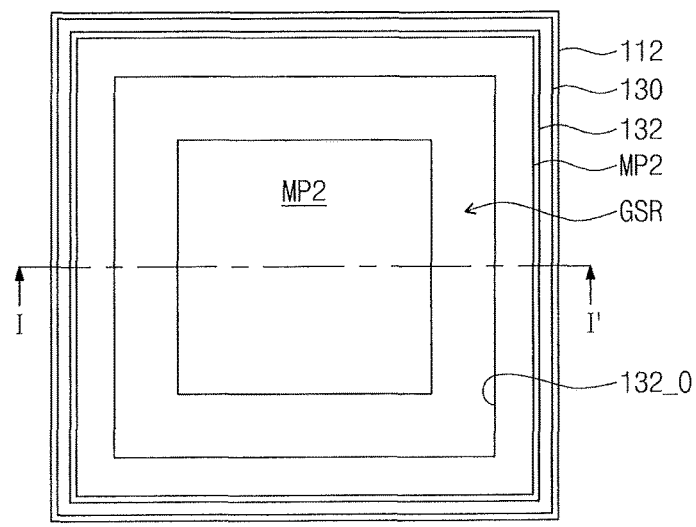
Figure 12B:
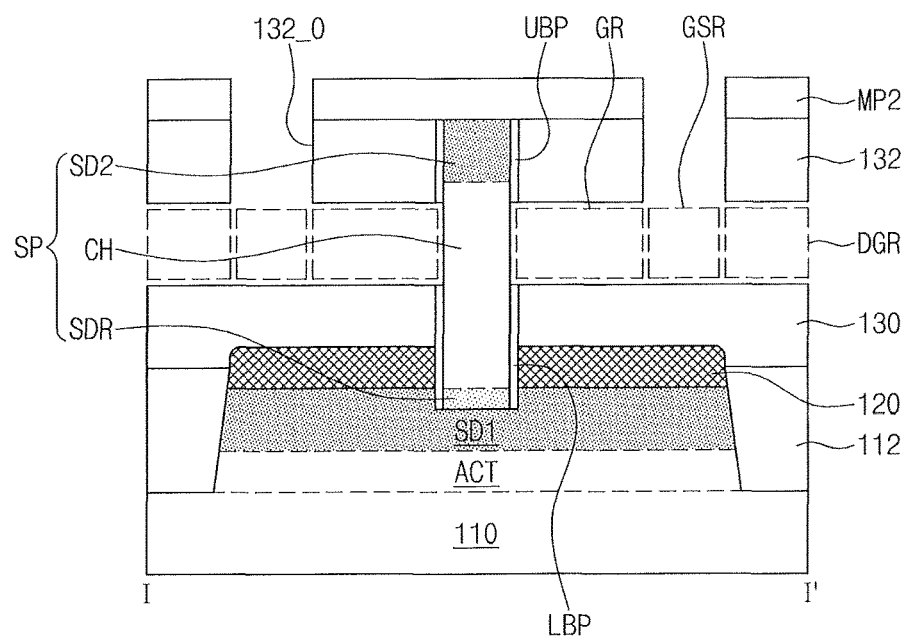

Referring to FIGS. 12A and 12B, the sacrificial layer SL may be removed. The removal of the sacrificial layer SL may form a gate separation region GSR, a gate region GR, and a dummy gate region DGR. As viewed in plan, the gate separation region GSR may be a region where a portion of the sacrificial layer SL below the opening 132_O is removed. As viewed in plan, the gate region GR may be a region where a portion of the sacrificial layer SL is removed from an interior side of the opening 132_O. As viewed in plan, the dummy gate region DGR may be a region where a portion of the sacrificial layer SL is removed from an exterior side of the opening 132_O, The sacrificial layer SL may be removed by, for example, by isotropically etching the sacrificial layer SL exposed through the opening 132_O, When the sacrificial layer SL includes silicon nitride, the removal of the sacrificial layer SL may be performed using an etchant which includes phosphoric acid, for example.

The removal of the sacrificial layer SL may expose a portion of the diffusion barrier layer BL and, additionally, remove the exposed portion of the diffusion barrier layer BL, Accordingly, the diffusion barrier layer BL may be separated into a lower diffusion barrier pattern LBP and an upper diffusion barrier pattern UBP. The gate region GR may include a region from which a portion of the diffusion barrier layer is removed.

In some exemplary embodiments, the removal of the sacrificial layer SL may recess a sidewall of the semiconductor pillar SP exposed through the gate region GR. Such exemplary embodiments may be employed to fabricate the semiconductor device discussed with reference to FIG. 3B, for example.

Figure 13A:
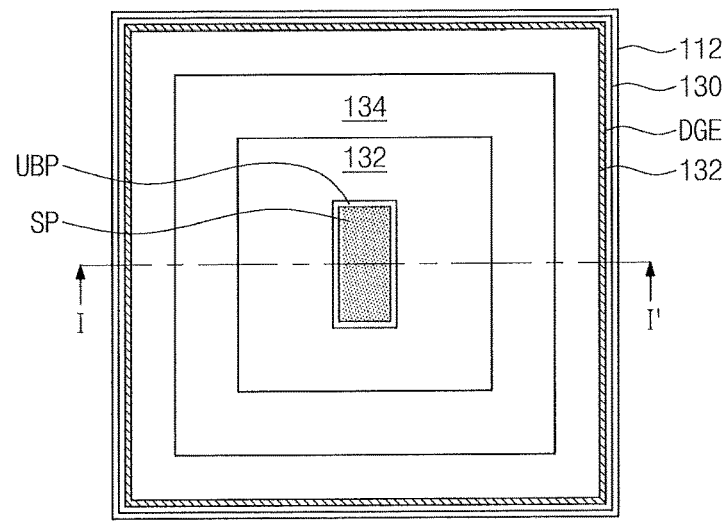
Figure 13B:
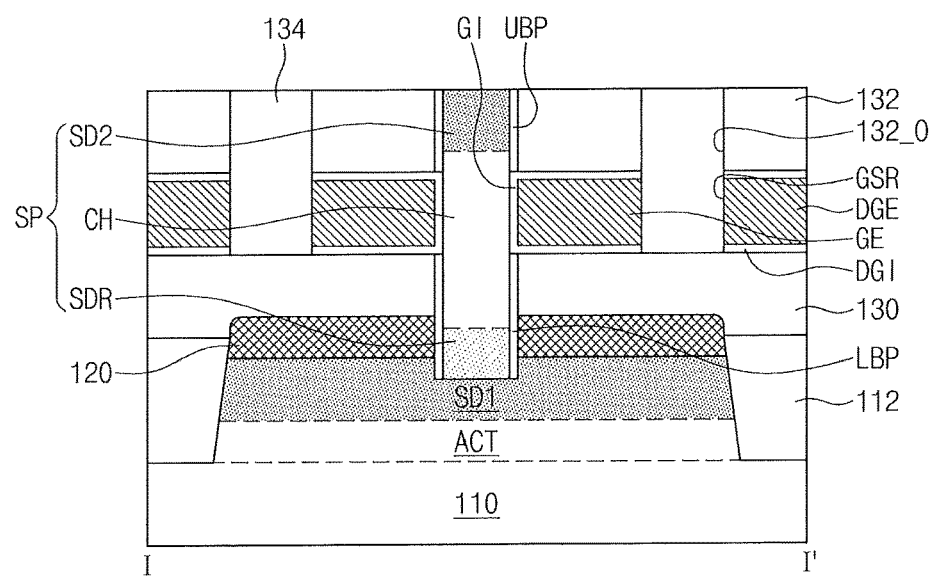

Referring to FIGS. 13A and 13B, a gate dielectric layer GI and a gate electrode GE may be sequentially formed in the gate region GR.

In exemplary embodiments, a preliminary gate dielectric layer (not shown) may be formed to conformally cover the gate region GR and thereafter a preliminary gate electrode layer (not shown) may be formed to fill the gate region GR. in exemplary embodiments, the preliminary gate dielectric layer and the preliminary gate electrode layer may extend into the gate separation region GSR, the dummy gate region DGR, and the opening 132_O, for example. Each of the preliminary gate dielectric layer and the preliminary gate electrode layer may be formed by, for example, using a chemical vapor deposition (CVD) or an atomic layer deposition (ALD) process.

The preliminary gate dielectric layer and the preliminary gate electrode layer may be removed from inside of the gate separation region GSR and the opening 132_O. The preliminary gate dielectric layer remaining inside the gate region GR may be referred to as the gate dielectric layer GI, and the preliminary gate dielectric layer remaining inside the dummy gate region DGR may be referred to as a dummy gate dielectric layer DGI. The preliminary gate electrode layer remaining inside the gate region GR may be referred to as the gate electrode GE, and the preliminary gate dielectric layer remaining inside the dummy gate region DGR may be referred to as a dummy gate electrode DGE. A wet etch process may be performed to partially remove each of the preliminary gate dielectric layer and the preliminary gate electrode layer, for example.

In exemplary embodiments in which the gate dielectric layer is formed before forming of the semiconductor pillar SP, it may be possible to skip the formation of the gate dielectric layer GI in the gate region GR. Such exemplary embodiments may be employed to fabricate the semiconductor device discussed with reference to FIG. 3C, for example.

A filling insulation layer 134 may be formed to fill the gate separation region GSR and the opening 132_O. The formation of the filling insulation layer 134 may include forming a preliminary filling insulation layer (not shown) to fill the gate separation region GSR and the opening 132_O and then performing a planarization process until the top surface of the second interlayer dielectric layer 132 is exposed. The preliminary filling insulation layer may be formed using, for example, a chemical vapor deposition (CVD) or a physical vapor deposition (PVD) process.

The semiconductor substrate 110 may be provided with heat during the forming of the gate dielectric layer GI, the gate electrode GE, and the filling insulation layer 134, and the heat may promote the first conductive type impurities to diffuse into the lower portion of the semiconductor pillar SP from the first source/drain region SD1. Accordingly, the sub-impurity region SDR may expand, and a top surface of the sub-impurity region SDR may be raised.

Referring back to FIGS. 1A to 1C, a third interlayer dielectric layer 136 may be formed to cover the second interlayer dielectric layer 132, the filling insulation layer 134, and the semiconductor pillar SP. The third interlayer dielectric layer 136 may be formed using, for example, a chemical vapor deposition (CVD) or a physical vapor deposition (PVD) process.

A first contact CNT1 may be formed to penetrate the third interlayer dielectric layer 136 and may be connected to the second source/drain region SD2, a second contact CNT2 may be formed to penetrate the third and second interlayer dielectric layers 136 and 132 and may be connected to the gate electrode GE, and a third contact CNT3 may be formed to penetrate the third interlayer dielectric layer 136, the filing insulation layer 134, and the first interlayer dielectric layers 130 and may be connected to the metal silicide layer 120. The formation of the first contact CNT1 may include, for example, forming a first contact hole that penetrates the third interlayer dielectric layer 136 and exposes the second source/drain region SD2 and then forming a conductive layer to fill the first contact hole. The formation of the second contact CNT2 may include, for example, forming a second contact hole that penetrates the second and third interlayer dielectric layers 132 and 136 and exposes the gate electrode GE and then forming a conductive layer to fill the second contact hole. The formation of the third contact CNT3 may include, for example, forming a third contact hole that penetrates the first interlayer dielectric, the filling insulation, and the third interlayer dielectric layers 130, 134 and 136 and exposes the metal silicide layer 120 and then forming a conductive layer to fill the third contact hole.

According to exemplary embodiments of the inventive concepts, a first source/drain region may be covered by the metal silicide layer having a relatively low resistivity. The metal silicide layer may be electrically connected to the third contact and horizontally extend to be adjacent to the semiconductor pillar. Accordingly, a relatively low resistance may be achieved between the third contact and the semiconductor pillar, compared with a case where the metal silicide layer is not provided or is formed locally on the lower portion of the third contact.

Additionally, the sub-impurity region may be formed in the lower portion of the semiconductor pillar. The sub-impurity region may have the same conductivity as the first source/drain region and may be connected to the first source/drain region. In this manner, the sub-impurity region may serve as an extension of the first source/drain region and may reduce the length of the channel region. As a result, in exemplary embodiments in accordance with principles of inventive concepts, a relatively low resistance may be achieved between the first and second source/drain regions.

Although inventive concepts have been described in connection with the embodiment of inventive concepts illustrated in the accompanying drawings, they are not limited thereto. It will be apparent to those skilled in the art that various substitution, modifications and changes may be thereto without departing from the scope and spirit of inventive concepts.

What is claimed is:

1. A semiconductor device, comprising:
   a semiconductor substrate including a first source/drain region in an upper portion of the semiconductor substrate;
   a metal silicide layer that covers a top surface of the first source/drain region;
   an interlayer dielectric layer that covers a top surface of the metal silicide layer;
   a semiconductor pillar that penetrates the metal silicide layer and the interlayer dielectric layer, and is connected to the first source/drain region in the upper portion of the semiconductor substrate, the semiconductor pillar including a second source/drain region in an upper portion of the semiconductor pillar, the semiconductor pillar including a sub-impurity region in a lower portion of the semiconductor pillar;
   a gate electrode on the interlayer dielectric layer, the gate electrode surrounding the semiconductor pillar in a plan view; and
   a contact connected to the metal silicide layer,
   wherein the semiconductor pillar comprises a bottom surface positioned in a recess extending through the metal silicide layer and in a top surface of the first source/drain region such that the bottom surface of the semiconductor pillar is positioned lower than the top surface of the first source/drain region,
   wherein a diffusion barrier pattern surrounds a lower sidewall of the semiconductor pillar, the diffusion barrier pattern being interposed between the semiconductor pillar and the metal silicide layer and extending between the semiconductor pillar and the interlayer dielectric layer, and the diffusion barrier pattern and the sub-impurity region cover the bottom surface of the recess,
   wherein the sub-impurity region comprises a top surface higher than a top surface of the metal silicide layer, and
   wherein each of the sub-impurity region and the first source/drain region comprises first conductive type impurities,
   a concentration of the first conductive type impurities being less in the sub-impurity region than in the first source/drain region.

2. The semiconductor device of claim 1, wherein the semiconductor pillar and the metal silicide layer are horizontally spaced apart from each other with the diffusion barrier pattern interposed therebetween.

3. The semiconductor device of claim 1, wherein the diffusion barrier pattern comprises a bottom surface lower than a bottom surface of the metal silicide layer.

4. The semiconductor device of claim 1, wherein side surfaces of the second source/drain are aligned with side surfaces of the semiconductor pillar.

5. The semiconductor device of claim 1, wherein the gate electrode overlaps the metal silicide layer in a plan view.

6. The semiconductor device of claim 5, wherein the metal silicide has an area greater than an area of the gate electrode in a plan view.

7. The semiconductor device of claim 1, further comprising a device isolation layer that is provided on the semiconductor substrate and defines an active region of the semiconductor substrate,
   wherein the first source/drain region is in the active region, and
   wherein the metal silicide layer covers a top surface of the active region.

8. The semiconductor device of claim 1, wherein the sub-impurity region comprises impurities having the same conductivity as the first source/drain region, and
   wherein a bottom surface of the sub-impurity region is lower than the top surface of the first source/drain region.

9. A semiconductor device, comprising:
   a semiconductor substrate including a first source/drain region in an upper portion of the semiconductor substrate, the first source/drain region having a first conductivity;
   a semiconductor pillar connected to the semiconductor substrate;
   a gate electrode on the first source/drain region, the gate electrode surrounding the semiconductor pillar in a plan view;
   a metal silicide layer that covers a top surface of the first source/drain region;
   a first interlayer dielectric layer that covers a top surface of the metal silicide layer; and
   a lower diffusion barrier pattern that surrounds a lower sidewall of the semiconductor pillar, the lower diffusion barrier pattern being interposed between the semiconductor pillar and the metal silicide layer and extending between the semiconductor pillar and the first interlayer dielectric layer,
   a second interlayer dielectric layer on the gate electrode, the gate electrode interleaved between the first and second interlayer dielectric layers; and
   an upper diffusion barrier pattern that surrounds an upper sidewall of the semiconductor pillar, the upper diffusion barrier pattern being interposed between the semiconductor pillar and the second interlayer dielectric layer,
   wherein the semiconductor pillar comprises:
   a second source/drain region in an upper portion of the semiconductor pillar, the second source/drain region having the first conductivity;
   a sub-impurity region in a lower portion of the semiconductor pillar, the sub-impurity region having the first conductivity, a bottom surface of the sub-impurity region being lower than a top surface of the first source/drain region; and a channel region between the second source/drain region and the sub-impurity region, the channel region having a second conductivity different from the first conductivity.

10. The semiconductor device of claim 9, wherein each of the sub-impurity region and the first source/drain region comprises first conductive type impurities, a concentration of the first conductive type impurities being less in the sub-impurity region than in the first source/drain region.

11. The semiconductor device of claim 9, wherein the sub-impurity region comprises first conductive type impurities, the sub-impurity region having a concentration profile where a concentration of the first conductive type impurities decreases with increasing distance from an interface between the sub-impurity region and the first source/drain region.

12. The semiconductor device of claim 9, wherein the sub-impurity region comprises a top surface higher than a top surface of the first source/drain region.

13. The semiconductor device of claim 9, wherein the sub-impurity region has a bottom portion positioned in the first source/drain region.

14. The semiconductor device of claim 9, wherein the sub-impurity region and the metal silicide layer are horizontally spaced apart from each other with the lower diffusion barrier pattern interposed therebetween, and wherein a top surface of the sub-impurity region is higher than a top surface of the metal silicide layer.

15. A semiconductor device, comprising:

a first source/drain region in an upper portion of a semiconductor substrate;

a low-resistance layer at a top surface of the first source/drain region;

a first interlayer dielectric layer that covers a top surface of the low-resistance layer;

a semiconductor pillar extending through the low-resistance layer and the first interlayer dielectric layer in a first direction of extension and connected to the first source/drain region in the upper portion of the semiconductor substrate, the semiconductor pillar including a second source/drain region in an upper portion thereof;

a lower diffusion barrier pattern that surrounds a lower sidewall of the semiconductor pillar, the lower diffusion barrier pattern being interposed between the semiconductor pillar and each of the low-resistance layer and the first interlayer dielectric layer;

a gate electrode on the first interlayer dielectric layer, the gate electrode surrounding the semiconductor pillar in a second direction transverse the first direction of extension;

a second interlayer dielectric layer on the gate electrode, the semiconductor pillar extending through the second interlayer dielectric layer in the first direction of extension;

an upper diffusion barrier pattern that surrounds an upper sidewall of the semiconductor pillar, the upper diffusion barrier pattern being interposed between the semiconductor pillar and the second interlayer dielectric layer, the upper diffusion barrier pattern spaced apart from the lower diffusion barrier pattern with the gate electrode interposed therebetween; and a contact connected to the low-resistance layer, wherein the semiconductor pillar comprises a bottom surface positioned in the first source/drain region such that the bottom surface of the semiconductor pillar is positioned lower than a top surface of the first source/drain region.

16. The semiconductor device of claim 15, wherein the low-resistance layer comprises a metal silicide layer.

17. The semiconductor device of claim 15, wherein the semiconductor pillar and the low-resistance layer are horizontally spaced apart from each other with the lower diffusion barrier pattern interposed therebetween and wherein the semiconductor pillar further comprises:

a sub-impurity region in a lower portion of the semiconductor pillar having a bottom surface that forms an interface with the first source/drain region, wherein the sub-impurity region comprises impurities having the same conductivity and concentration as the first source/drain region at the interface, with decreasing impurity concentration as a distance from the interface increases.

18. The semiconductor device of claim 17 wherein the lower diffusion barrier pattern includes a bottom surface lower than a bottom surface of the low-resistance layer, and wherein the sub-impurity region comprises a top surface higher than a top surface of the low-resistance layer.

19. The semiconductor device of claim 15, wherein the gate electrode surrounds a portion of the semiconductor pillar in an area of the pillar that coincides with a channel region between the first and second source/drain regions.

* * * * *